(12) United States Patent
Lipkin

(10) Patent No.: US 6,610,366 B2
(45) Date of Patent: Aug. 26, 2003

(54) METHOD OF N$_2$O ANNEALING AN OXIDE LAYER ON A SILICON CARBIDE LAYER

(75) Inventor: Lori A. Lipkin, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 09/834,283

(22) Filed: Apr. 12, 2001

(65) Prior Publication Data

US 2002/0172774 A1 Nov. 21, 2002

Related U.S. Application Data

(60) Provisional application No. 60/237,822, filed on Oct. 3, 2000, and provisional application No. 60/237,426, filed on Oct. 3, 2000.

(51) Int. Cl.$^7$ .............................. B05D 5/12; B05D 3/04; B05D 3/02
(52) U.S. Cl. ................... 427/378; 427/376.2; 427/377; 427/126.3; 427/255.27
(58) Field of Search ............................ 427/376.2, 377, 427/378, 126.3, 255.27; 438/787

(56) References Cited

U.S. PATENT DOCUMENTS

| | | | |
|---|---|---|---|
| 3,924,024 A | 12/1975 | Naber et al. ................... 427/95 |
| 4,466,172 A | 8/1984 | Batra .......................... 29/571 |
| 4,875,083 A | 10/1989 | Palmour ..................... 357/23.6 |
| 5,170,231 A | 12/1992 | Fujii et al. ................... 357/23.2 |
| 5,170,455 A | 12/1992 | Goossen et al. ............... 385/89 |
| 5,184,199 A | 2/1993 | Fujii et al. ...................... 29/10 |
| 5,506,421 A | 4/1996 | Palmour ....................... 257/77 |
| 5,510,630 A | 4/1996 | Agarwal et al. .............. 257/77 |
| 5,726,463 A | 3/1998 | Brown et al. ................. 257/77 |
| 5,763,905 A | 6/1998 | Harris .......................... 257/77 |
| 5,837,572 A | 11/1998 | Gardner et al. ............. 438/199 |
| 5,885,870 A | 3/1999 | Maiti et al. .................. 438/261 |
| 5,939,763 A | * 8/1999 | Hao et al. .................... 257/411 |
| 5,960,289 A | * 9/1999 | Tsui et al. ................... 257/411 |
| 5,972,801 A | 10/1999 | Lipkin et al. ................ 438/770 |
| 6,025,608 A | 2/2000 | Harris et al. .................... 257/77 |
| 6,054,352 A | 4/2000 | Ueno .......................... 438/268 |
| 6,096,607 A | 8/2000 | Ueno .......................... 438/522 |
| 6,100,169 A | 8/2000 | Suvorov et al. ............. 438/519 |
| 6,107,142 A | 8/2000 | Suvorov et al. ............. 438/285 |
| 6,117,735 A | 9/2000 | Ueno .......................... 438/268 |
| 6,165,822 A | 12/2000 | Okuno et al. ................ 438/142 |
| 6,190,973 B1 | * 2/2001 | Berg et al. ................... 438/275 |
| 6,204,203 B1 | 3/2001 | Narwanker et al. ......... 438/785 |
| 6,211,035 B1 | 4/2001 | Moise et al. ................ 438/396 |
| 6,221,700 B1 | 4/2001 | Okuno et al. ................ 438/151 |

(List continued on next page.)

FOREIGN PATENT DOCUMENTS

| | | |
|---|---|---|
| DE | 198 09 554 | 9/1998 |
| DE | 19900171 | 12/2000 |

(List continued on next page.)

OTHER PUBLICATIONS

Li et al., "Improving SiO2 Growth on P–Type 4H–SiC by NO Annealing", Materials Science Forum, vols. 264–268, pp. 869–872, 1998.*

(List continued on next page.)

Primary Examiner—Michael Barr
(74) Attorney, Agent, or Firm—Myers Bigel Sibley & Sajovec, P.A.

(57) ABSTRACT

Methods for fabricating a layer of oxide on a silicon carbide layer are provided by forming the oxide layer on the silicon carbide layer and then annealing the oxide layer in an N$_2$O environment at a predetermined temperature profile and at a predetermined flow rate profile of N$_2$O. The predetermined temperature profile and the predetermined flow rate profile are selected so as to reduce interface states of the oxide/silicon carbide interface with energies near the conduction band of SiC.

34 Claims, 6 Drawing Sheets

U.S. PATENT DOCUMENTS

| | | | |
|---|---|---|---|
| 6,238,967 B1 | 5/2001 | Shiho et al. | 438/244 |
| 6,246,076 B1 | 6/2001 | Lipkin et al. | 257/77 |
| 6,297,172 B1 * | 10/2001 | Kashiwagi | 438/773 |
| 6,344,663 B1 | 2/2002 | Slater, Jr. et al. | 257/77 |
| 6,455,892 B1 | 9/2002 | Okuno et al. | 257/328 |
| 2001/0055852 A1 | 12/2001 | Moise et al. | 438/396 |
| 2002/0072247 A1 | 6/2002 | Lipkin et al. | 438/767 |

FOREIGN PATENT DOCUMENTS

| | | |
|---|---|---|
| DE | 10036208 | 2/2002 |
| EP | 0 637 069 A1 | 2/1995 |
| EP | 0 637 069 B1 | 1/2001 |
| JP | 3157974 | 7/1991 |
| JP | 8264766 | 10/1996 |
| JP | 9205202 | 8/1997 |
| JP | 11191559 | 7/1999 |
| JP | 11238742 | 8/1999 |
| JP | 11261061 | 9/1999 |
| JP | 11266017 | 9/1999 |
| JP | 11274487 | 10/1999 |
| JP | 2000049167 | 2/2000 |
| JP | 2000082812 | 3/2000 |
| JP | 2000252461 | 9/2000 |
| JP | 2000106371 | 4/2001 |
| WO | WO 97/17730 | 5/1997 |
| WO | WO 97/39485 | 10/1997 |

OTHER PUBLICATIONS

Ueno et al., "Counter–Doped MOSFET's of 4H–SiC", IEEE Electron Device Letters, vol. 20, No. 12, pp. 624–626, Dec. 1999.*

Shenoy et al., "The Planar 6H–SiC ACUFFET: A New High–Voltage Power MOSFET Structure", IEEE Electron Device Letters, vol. 18, No. 12, pp. 589–591, Dec. 1997.*

M. K. Das. L.A. Lipkin, J.W. Palmour, G.Y. Chung, J.R. Williams, K. McDonald, and L.C. Feldman, "High Mobility 4H–SiC Inversion Mode MOSFETs Using Thermally Grown, NO Annealed $SiO_2$," IEEE Device Research Conference, Denver, CO Jun. 19–21, 2000.

G.Y. Chung, C.C. Tin, J.R. Williams, K. McDonald, R.A. Weller, S.T. Pantelides, L.C. Feldman, M.K. Das, and J.W. Palmour, "Improved Inversion Channel Mobility for 4H–SiC MOSFETs Follwoing High Temperature Anneals in Nitric Oxide," IEE Electron Device Letters accepted for publication no date.

G.Y. Chung, C.C. Tin, J.R. Williams, K. McDonald, M. Di Ventra, S.T. Pantelides, L.C. Feldman, and R.A. Weller, "Effect of nitric oxide annealing on the interface trap densities near the band edges in 4H." Applied Physics Letters, vol. 76, No. 13, pp. 1713–1715, Mar. 2000.

P.T. Lai, Supratic Chakroaborty, C.L. Chan, and Y.C. Cheng, "Effects of nitridation and annealing on interface properties of thermally oxidized $SiO_2$/SiC metal–oxide–semiconductor system," Applied Physics letters, vol. 76, No. 25, pp. 3744–3746, Jun. 2000.

J.P. Xu, P.T. Lai, C.L. Chan, B. Li, and Y.C. Cheng, "Improved Performance and Reliability of $N_2O$–Grown Oxynitride on 6H–SiC," IEEE Electron Device Letters, vol. 21, No. 6, pp. 298–300, Jun. 2000.

L.A. Lipkin and J.W. Palmour, "Low interface state density oxides on p–type SiC," Materials Forum vols. 264–268, pp. 853–856, 1998.

A.K. Agarwal, J.B. Casady, L.B. Rowland, W.F. Valek, M.H. White, and C.D. Brandt, "1.1kV 4H–SiC Power UMOSFET's," IEEE Electron Device Letters, vol. 18, No. 12, pp. 586–588, Dec. 1997.

A.K. Agarwal, J.B. Casady, L.B. Rowland, W.F. Valek, and C.D. Brandt, "1400 V 4H–SiC Power MOSFET's," Materials Science Forum vols. 264–268, pp. 989–992, 1998.

J. Tan, J.A. Cooper, Jr., and Mr.R. Mellock, "High–Voltage Accumulation–Layer UMOSFETs in 4H–SiC," IEEE Electron Device Letters, vol. 19, No. 12, pp. 487–489, Dec. 1998.

J.N. Shenoy, J.A. Cooper and M.R. Meelock, "High–Voltage Double–Implanted Power MOSFETs in 6H–SiC," IEEE Electron Device Letters, vol. 18, No. 3, pp. 93–95, Mar. 1997.

J.B. Casady, A.K. Agarwal, L.B. Rowland, W.F. Valek, and C.D. Brandt, "900 V DMOS and 1100 V UMOS 4H–SiC Power FETs," IEEE Device Research Conference, Ft. Collins, CO Jun. 23–25, 1997.

R. Schörner, P. Friedrichs, D. Peters, H. Mitlehner, B. Weis, and D. Stephani, "Rugged Power MOSFETs in 6H–SiC with Blocking Capability up to 1800 V," Materials Science Forum vols. 338–342, pp. 1295–1298, 2000.

V.R. Vathulya and M.H. White, "Characterization of Channel Mobility on Implanted SiC to Determine Polytype Suitability for the Power DIMOS Structure," Electronic Materials Conference, Santa Barbara, CA, Jun. 30–Jul. 2, 1999.

A.V. Suvorov, L.A. Lipkin, G.M. Johnson, R. Singh and J.W. Palmour, "4H–SiC Self–Aligned Implant–Diffused Structure for Power DMOSFETs," Materials Science Forum vols. 338–342, pp. 1275–1278, 2000.

R. Schorner, P. Friedrichs, D. Peters, and D. Stephani, "Significantly Improved Performance of MOSFETs on Silicon Carbide Using the 15R–SiC Polytype," IEEE Electron Device Letters, vol. 20, No. 5, pp. 241–244, May 1999.

S.T. Pantelides, "Atomic Scale Engineering of SiC Dielectric Interfaces," DARPA/MTO High Power and ONR Power Switching MURI Reviews, Rosslyn, VA, Aug. 10–12, 1999.

V.V. Afanas'ev, M. Bassler, G. Pensl, and M. Schulz, "Intrinsic $SiC/SiO_2$ Interface States," Phys. Stat. Sol. (a), vol. 162, pp. 321–337, 1997.

S. Sridevan, P.K. McLarty, and B.J. Baliga, "On the Presence of Aluminum in Thermally Grown Oxides on 6H–Silicon Carbide," IEEE Electron Device Letters, vol. 17, No. 3, pp. 136–138, Mar. 1996.

M.A. Capano, S.Ryu, J.A. Cooper, Jr., M.R. Melloch, K. Rottner, S. Karlsson, N. Nordell, A. Powell, and D.E. Walker, Jr., "Surface Roughening in Ion Implanted 4H–Silicon Carbide," Journal of Electronic Materials, vol. 28, No. 3, pp. 214–218, Mar. 1999.

M.K. Das, J.A. Cooper, Jr., M.R. Melloch, and M.A. Capano, "Inversion Channel Mobility in 4H–and 6H–SiC MOSFETs," IEEE Semiconductor Interface Specialists Conference, San Diego, CA, Dec. 3–5, 1998.

P.M. Shenoy and B.J. Baliga, "The Planar 6H–SiC ACCUFET: A New High–Voltage Power MOSFET Structure," IEEE Electron Device Letters, vol. 18, No. 12, pp. 589–591, Dec. 1997.

Ranbir Singh, Sei–Hyung Ryu and John W. Palmour, "High Temperature, High Current, 4H–SiC Accu–DMOSFET," Materials Science Forum vols. 338–342, pp. 1271–1274, 2000.

Y. Wang, C. Weitzel, and M. Bhatnagar, "Accumulation-Mode SiC Power MOSFET Design Issues," *Materials Science Forum*, vols. 338–342, pp. 1287–1290.

A.K. Agarwal, N.S. Saks, S.S. Mani, V.S. Hegde and P.A. Sanger, "Investigation of Lateral RESURF, 6H–SiC MOSFETs," *Materials Science Forum*, vols. 338–342, pp. 1307–1310, 2000.

S. Sridevan and B. Jaynat Baliga, "Lateral N–Channel Inversion Mode 4H–SiC MOSFET's," *IEEE Electron Device Letters*, vol. 19, No. 7, pp. 228–230, Jul. 1998.

D. Alok, E. Arnold, and R. Egloff, "Process Dependence of Inversion Layer Mobility in 4H–SiC Devices," *Materials Science Forum*, vols. 338–342, pp. 1077–1080, 2000.

K. Ueno and Tadaaki Oikawa, "Counter–Doped MOSFET's of 4H–SiC." *IEEE Electron Device Letters*, vol. 20, No. 12, pp. 624–626, Dec. 1999.

V. R. Vathulya, H. Shang, and M. H. White, "A Novel 6H–SiC Power DMOSFET with Implanted P–Well Spacer." *IEEE Electron Device Letters*, vol. 20, No. 7, Jul. 1999, pp. 354–356.

A.K. Agarwal, S. Seshadri, and L. B. Rowland, "Temperature Dependence of Fowler–Nordheim Current in 6H–and 4H–SiC MOS Capacitors." *IEEE Electron Device Letters*, vol. 18, No. 12, Dec. 1997, pp. 592–594.

P.J. Tobin, Y. Okada, S. A Ajuria, V. Lakhotia, W. A Feil, and R. I. Hedge, "Furnace formation of silicon oxynitride thin dielectrics in nitrous oxide ($N_2O$): The role of nitric oxide (NO)." *Journal of Applied Physics*. vol. 75, No. 3, Feb. 1, 1994, pp. 1811–1817.

Sze, S.M. *Physics of Semiconductor Devices*, John Wiley & Sons, pp. 383–390.

H.F. Li, S. Dimitrijev, H.B. Harrison, D. Sweatman, and P.T. Tanner. "Improving $SiO_2$ Grown on P–Type 4H–SiC by NO Annealing." *Materials Science Forum*. vols. 264–268 (1998) pp. 869–872.

K. Ueno, R. Asai, and T. Tsuji. "4H–SiC MOSFET's Utilizing the $H_2$ Surface Cleaning Technique." *IEEE Electron Device Letters*, vol. 19, No. 7, Jul. 1998, pp. 244–246.

Chung et al. "The Effect of Si:C Source Ratio on $SiO_2$/SiC Interface State Density for Nitrogen Doped 4H and 6H–SiC," *Materials Science Forum*. (2000) vols. 338–342, pp. 1097–1100.

Pantelides et al. "Atomic–Scale Engineering of the SiC–$SiO_2$ Interface," *Materials Science Forum*. (2000) vols. 338–342, pp. 1133–1136.

Chakraborty et al. "Interface properties of $N_2O$–annealed $SiO_2$/SiC systems," *Proc. 2000 IEEE Electron Devices Meeting*. Hong Kong, China, Jun. 24, 2000, pp. 108–111.

Lipkin et al. "Cha ges and State–of–the–Art Oxides in SiC," *Ma Soc. Symp. Proc.* vol. 640, Nov. 2000, pp. 27–29.

Jamet, et al. "Physical properties of $N_2O$ and NO–nitrided gate oxides grown on 4H SiC," *Applied Physics Letters*. vol. 79, No. 3, Jul. 16, 2001, pp. 323–5.

International Search Report, PCT/US01/42414, Apr. 23, 2002, 10 pages.

Agarawal et al. "A Critical Look at the Performance Advantages and Limitations of 4H–SiC Power UMOSFET Structures," *1996 IEEE ISPSD and IC's Proc.*, May 20–23, 1996, pp. 119–122.

Lipkin et al. "Insulator Investigation on SiC for Improved Reliability," *IEEE Transactions on Electron Devices*. vol. 46, No. 3, Mar. 1999, pp. 525–532.

Agarwal et al. "Temperature Dependence of Fowler–Nordheim Current in 6H–and 4H–SiC MOS Capacitors," *IEEE Electron Device Letters*. vol. 18, No. 12, Dec. 1997, pp. 592–594.

Kobayashi et al. "Dielectric Breakdown and Current Conduction of Oxide–Nitride/Oxide Multi–Layer Structures," *1990 IEEE Symposium on VLSI Technology*. pp. 119–120.

Ma et al. "Fixed and trapped charges at oxide–nitride–oxide heterostructure interfaces formed by remote plasma enhanced chemical vapor deposition," *J. Vac. Sci. Technol. B*. vol. 11, No. 4, Jul./Aug. 1993, pp. 1533–40.

Das, Mrinal K. Graduate thesis entitled, *Fundamental Studies of the Silicon Carbide MOS Structure*. Purdue University. No date provided.

Lai et al. "Interface Properties of $N_2O$–Annealed $NH_3$–Treated 6H–SiC MOS Capacitor," *Proc. 1999 IEEE Hong Kong Electron Devices Meeting*, Jun. 26, 1999, pp. 46–49.

Lipkin et al. "Insulator Investigation on SiC for Improved Reliability," *IEEE Transactions on Electron Devices*. vol. 46, No. 3, Mar. 1999, pp. 525–532.

Copy of International Search Report for PCT/US01/30715.

Lai et al., "Interface Properties of N2O–Annealed NH3–Treated 6H–SiC MOS Capacitor", Proc. 1999 IEEE Hong Kong Electron Devices Meeting, Jun. 26, 1999, pp. 46–49.*

Copy of International Search Report for PCT/US02/11691.

Xu et al. "Improved Performance and Reliability of $N_2O$–Grown Oxynitride on 6H–SiH," *IEEE Electron Device Letters*. vol. 21, No. 6, Jun. 2000, pp. 298–300.

Wang et al. "High Temperature Characteristics of High–Quality SiC MIS Capacitors with O/N/O Gate Dielectric," *IEEE Transactions on Electron Devices*. vol. 47, No. 2, Feb. 2000, pp. 458–462.

Lipkin et al. "Challenges and State–of–the–Art of Oxides on SiC," *Mat. Res. Symp. Proc.* vol. 640, 2001.

Cho et al. "Improvement of charge trapping by hydrogen post–oxidation annealing in gate oxide of 4H–SiC methel–oxide–semiconductor capacitors," *Applied Physics Letters*. vol. 77, No. 8, pp. 1215–1217. Aug. 2000.

Fukuda et al. "Improvement of $SiO_2$/4H–SiC Interface Using High–Temperature Hydrogen Annealing at Low Pressure and Vacuum Annealing," *Jpn J. Appl. Phys.* vol. 38, Apr. 1999, pp. 2306–2309.

Suzuki et al. "Effect of Post–oxidation–annealing in Hydrogen on $SiO_2$/4H–SiC Interface," *Materials Science Forum*, vol. 338–342 (2000) 1073–6.

Leonard et al. "Long term stability of gate–oxides on n–and p–type silicon carbide studied by charge injection techniques," *Materials Science Engineering*, vol. 46, No. 1–3, Apr. 1997, pp. 263–266.

Fukuda et al. "Improvement of $SiO_2$/4H–SiC Interface by Using High Temperature Hydrogen Annealing at 1000° C," *Extended Abstracts of the International Conference on Solid State Devices and Materials*, Japan Society of Applied Physics, Tokyo, Japan, Sep. 1998.

Chang et al. "Observation of a Non–stoichiometric Layer at the Silicon Dioxide—Silicon Carbide Interface: Effect of Oxidation Temperature and Post–Oxidation Processing Conditions," *Mat. Res. Soc. Symp. Proc.* vol. 640, 2001.

Chakraborty et al. "Interface properties of $N_2O$–annealed $SiO_2$/SiC systems," *Proc. 2000 IEEE Electron Devices Meeting*. Hong Kong, China, Jun. 24, 2000, pp. 108–111.

* cited by examiner

METHOD OF N₂O ANNEALING AN OXIDE LAYER ON A SILICON CARBIDE LAYER

RELATED APPLICATIONS

The present application claims priority from U.S. Provisional Application Serial No. 60/237,822, entitled "Method of Improving an Interface Between a Silicon Carbide Layer and an Oxide Layer" and U.S. Provisional Application Serial No. 60/237,426 entitled "SiC Power MOSFET and Method of Fabrication" which were filed Oct. 3, 2000, the disclosures of which are incorporated by reference as if set forth fully herein.

STATEMENT OF GOVERNMENT INTEREST

The present invention was made with Government support under contract number DAAD17-99-C-0009 was awarded by the United States Army Research Labs. The Government has certain rights in this invention.

FIELD OF THE INVENTION

The present invention relates to the fabrication of semiconductor devices and more particularly, to the fabrication of oxide layers on silicon carbide (SiC).

BACKGROUND OF THE INVENTION

Devices fabricated from silicon carbide are typically passivated with an oxide layer, such as $SiO_2$, to protect the exposed SiC surfaces of the device and/or for other reasons. However, the interface between SiC and $SiO_2$ may be insufficient to obtain a high surface mobility of electrons. More specifically, the interface between SiC and $SiO_2$ conventionally exhibits a high density of interface states, which may reduce surface electron mobility.

Recently, annealing of a thermal oxide in a nitric oxide (NO) ambient has shown promise in a planar 4H-SiC MOSFET structure not requiring a p-well implant. See M. K. Das, L. A. Lipkin, J. W. Palmour, G. Y. Chung, J. R. Williams, K. McDonald, and L. C. Feldman, "High Mobility 4H-SiC Inversion Mode MOSFETs Using Thermally Grown, NO Annealed $SiO_2$," IEEE Device Research Conference, Denver, CO, Jun. 19-21, 2000 and G. Y. Chung, C. C. Tin, J. R. Williams, K. McDonald, R. A. Weller, S. T. Pantelides, L. C. Feldman, M. K. Das, and J. W. Palmour, "Improved Inversion Channel Mobility for 4H-SiC MOSFETs Following High Temperature Anneals in Nitric Oxide," IEEE Electron Device Letters accepted for publication, the disclosures of which are incorporated by reference as if set forth fully herein. This anneal is shown to significantly reduce the interface state density near the conduction band edge. G. Y. Chung, C. C. Tin, J. R. Williams, K. McDonald, M. Di Ventra, S. T. Pantelides, L. C. Feldman, and R. A. Weller, "Effect of nitric oxide annealing on the interface trap densities near the band edges in the 4H polytype of silicon carbide," Applied Physics Letters, Vol. 76, No. 13, pp. 1713–1715, Mar. 2000, the disclosure of which is incorporated herein as if set forth fully. High electron mobility (35–95 $cm^2$/Vs) is obtained in the surface inversion layer due to the improved MOS interface.

Unfortunately, NO is a health hazard having a National Fire Protection Association (NFPA) health danger rating of 3, and the equipment in which post-oxidation anneals are typically performed is open to the atmosphere of the cleanroom. They are often exhausted, but the danger of exceeding a safe level of NO contamination in the room is not negligible.

Growing the oxide in $N_2O$ is possible. J. P. Xu, P. T. Lai, C. L. Chan, B. Li, and Y. C. Cheng, "Improved Performance and Reliability of $N_2O$-Grown Oxynitride on 6H-SiC," IEEE Electron Device Letters, Vol. 21, No. 6, pp. 298–300, June 2000, the disclosure of which is incorporated by reference as if set forth fully herein. Post-growth nitridation of the oxide on 6H-SiC in $N_2O$ at a temperature of 1100° C. has also been investigated by Lai et al. P. T. Lai, Supratic Chakraborty, C. L. Chan, and Y. C. Cheng, "Effects of nitridation and annealing on interface properties of thermally oxidized $SiO_2$/SiC metal-oxide-semiconductor system," Applied Physics Letters, Vol. 76, No. 25, pp. 3744–3746, June 2000, the disclosure of which is incorporated by reference as if set forth fully herein. However, Lai et al. concluded that such treatment deteriorates the interface quality which may be improved with a subsequent wet or dry anneal in $O_2$ which may repair the damage induced by nitridation in $N_2O$. Moreover, even with a subsequent $O_2$ anneal, Lai et al. did not see any significant reduction in interface state density as compared to the case without nitridation in $N_2O$.

Thus, there is a need for a method of improving the quality of the $SiC/SiO_2$ interface using an $N_2O$ anneal.

SUMMARY OF THE INVENTION

Embodiments of the present invention provide methods for fabricating a layer of oxide on a silicon carbide layer by forming the oxide layer on the silicon carbide layer and then annealing the oxide layer in an $N_2O$ environment at a predetermined temperature profile and at a predetermined flow rate profile of $N_2O$. The predetermined temperature profile and/or predetermined flow rate profile may be constant or variable and may include ramps to steady state conditions. The predetermined temperature profile and the predetermined flow rate profile are selected so as to reduce interface states of the oxide/silicon carbide interface with energies near the conduction band of SiC.

In particular embodiments of the present invention, the predetermined temperature profile may result in an anneal temperature of greater than about 1100° C. In such embodiments, the anneal temperature may be greater than about 1175° C. In a particular embodiment, the anneal temperature is about 1200° C. In further embodiments of the present invention, the anneal may be about 1.5 hours or about 3 hours.

In additional embodiments of the present invention, the predetermined flow rate profile includes one or more flow rates of from about 2 Standard Liters per Minute (SLM) to about 8 SLM. In particular embodiments, the flow rates is from about 3 to about 5 Standard Liters per Minute.

In further embodiments, the anneal of the oxide layer is carried out for about 3 hours. Furthermore, the anneal of the oxide layer may be followed by annealing the oxide layer in Ar or $N_2$. Such an anneal in Ar or $N_2$ may be carried out for about one hour.

In still further embodiments of the present invention, the predetermined flow rate profile provides a velocity or velocities of the $N_2O$ of from about 0.37 cm/s to about 1.46 cm/s. In particular embodiments, the predetermined flow rate profile provides a velocity or velocities of the $N_2O$ of from about 0.5 cm/s to about 1 cm/s.

Additionally, the oxide layer may be formed by depositing the oxide layer and/or by thermally growing the oxide layer. A wet reoxidation of the oxide layer may also be performed.

In further embodiments, methods for fabricating a layer of oxide on a silicon carbide layer include forming the oxide layer on the silicon carbide layer and annealing the oxide layer in an $N_2O$ environment at a predetermined temperature profile which includes an anneal temperature of greater than about 1100° C. and at a predetermined flow rate profile for the $N_2O$. The predetermined flow rate profile may be selected to provide an initial residence time of the $N_2O$ of at least 11 seconds.

In particular embodiments of the present invention, the initial residence time may be from about 11 seconds to about 45 seconds. In still further embodiments of the present invention, the initial residence time is from about 16 seconds to about 31 seconds.

Additionally, a total residence time of the $N_2O$ may be from about 28 seconds to about 112 seconds. In such embodiments of the present invention, the total residence time may also be from about 41 seconds to about 73 seconds.

DETAILED DESCRIPTION OF THE INVENTION

Figure 1:
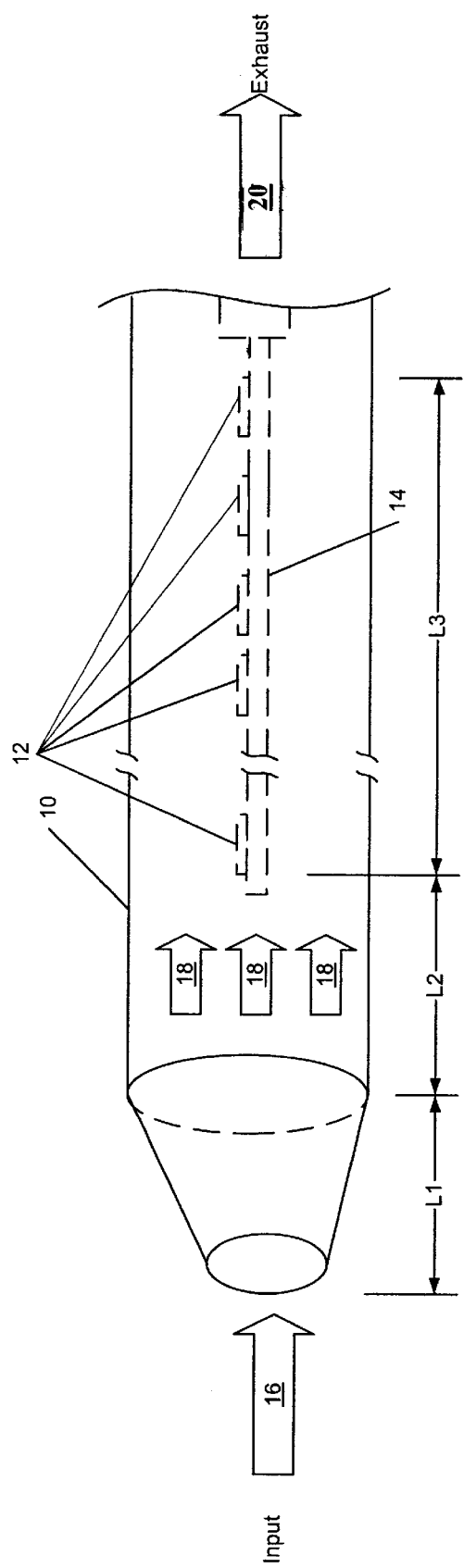
FIG. 1 is a schematic illustration of a furnace tube suitable for use in embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Embodiments of the present invention provide methods which may improve the interface between an oxide layer and SiC. The process is especially advantageous in the fabrication of Metal-Oxide-Semiconductor (MOS) devices created on SiC. Using embodiments of the present invention, interface states with energy levels near the conduction band of SiC may be dramatically reduced. Reduction of such defects may be advantageous, since these defects are currently viewed as the greatest limit to a MOSFET's effective surface channel mobility.

Embodiments of the present invention will now be described with reference to FIGS. 1 and 2 which are a schematic illustration of a furnace tube suitable for use in embodiments of the present invention and a flow chart illustrating operations according to particular embodiments of the present invention. As seen in FIG. 1, the furnace tube 10 has a plurality of wafers 12 of SiC with an oxide layer, such as $SiO_2$, formed thereon. Preferably, the SiC layer is 4H-SiC. The wafers 12 are placed on a carrier 14 such that the wafers will, typically have a fixed position in the furnace tube 10. The carrier 14 is positioned so that the wafers are a distance L1+L2 from an inlet of the furnace tube 10 and extend for a distance L3 within the furnace tube 10. Input gases 16 are passed into the furnace tube 10 and are heated as they traverse the distance L1 based on a predetermined temperature profile so as to provide the heated gases 18. The heated gases 18 are maintained at temperatures based on the predetermined temperature profile and traverse the distance L2 to reach the first of the wafers 12. The heated gases 18 continue to pass through the furnace tube 10 until they leave the furnace tube 10 through an outlet port as exhaust gases 20. Thus, the heated gases 18 traverse the distance L3. The heated gases 18 are preferably maintained at a substantially constant temperature for the distances L2 and L3, however, as will be appreciated by those of skill in the art in light of the present disclosure, various temperature profiles may also be utilized. Such profiles may include variations in temperature over time or distance. However, the predetermined temperature profile should include an anneal temperature of greater than about 1100° C.

As is seen in FIG. 1, the heated gases 18 may reach a temperature at which the $N_2O$ begins to break down into its constituents at the end of the L1 distance. This distance may depend on the physical characteristics of the furnace tube 10, the predetermined temperature profile and the flow rate profile. After reaching the temperature at which the $N_2O$ begins to break down, the heated gases 18 traverse the distance L2 before reaching the wafers 12. The amount of time that it takes the heated gases to traverse the distance L2 is referred to herein as an "initial residence time." Preferably, the heated gasses are maintained at a substantially constant temperature corresponding to an anneal temperature of greater than about 100° C. for the initial residence time. However, as will be appreciated by those of skill in the art, differing heating profiles could be utilized which increase or decrease the initial residence time. It is preferred, however, that the heating profile be rapid such that the initial residence time is substantially the same as the time-that the heated gases 18 are maintained at an anneal temperature of greater than about 1100° C.

The total amount of time that it takes the heated gases 18 to traverse the distance L2+L3 is referred to herein as the "total residence time." As will be appreciated by those of skill in the art in light of the present disclosure, these residence times depend on the velocity of the heated gases 18 through the furnace tube 10 which, may be determined based on the flow rates of the heated gases 18 and the cross-sectional area of the furnace tube 10. Such velocities may be average velocities, for example, if turbulent flow is achieved, or may be actual velocities, for example, in laminar flow systems. Thus, the term velocity is used herein to refer to both average and actual velocities.

Figure 2:
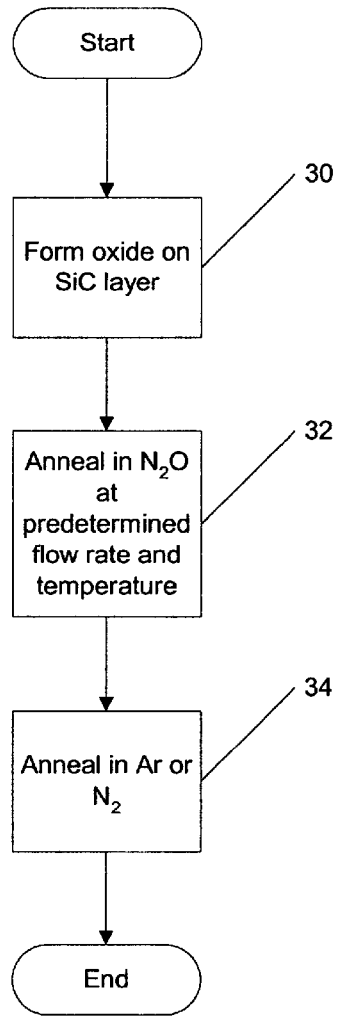
FIG. 2 is a flowchart illustrating processing steps according to embodiments of the present invention.

FIG. 2 illustrates operations according to embodiments of the present invention and will be described with reference to FIG. 1. However, as will be appreciated by those of skill in the art in light of the present disclosure, embodiments of the present invention are not limited to the furnace tube embodiment illustrated in FIG. 1 but may be carried out in any system capable of providing the conditions described herein. Turning to FIG. 2, operations may begin by forming an oxide layer on SiC layer (block 30). The SiC layer may be an epitaxial layer or a substrate. Furthermore, the oxide layer may be formed by deposition, such as Low Pressure Chemical Vapor Deposition (LPCVD) and/or thermally grown through a thermal oxidation process. Preferably, the oxide layer is formed utilizing a wet reoxidation process as described in U.S. Pat. No. 5,972,801, the disclosure of which is incorporated herein by reference as if set forth fully herein. Furthermore, the oxide layer may be formed in situ with the subsequent $N_2O$ anneal and in situ with the SiC layer or it may be formed in a separate chamber.

The oxide layer is then annealed in an $N_2O$ environment at a predetermined temperature and a predetermined flow rate (block 32). Preferably, the oxide is annealed using a predetermined temperature profile which includes an anneal temperature of greater than about 1100° C. in a chamber in which $N_2O$ is supplied at a flow rate profile within predetermined flow rate limits. In further embodiments, the temperature of the anneal is 1175° C. or higher. In particular embodiments, an anneal temperature of 1200° C. may be utilized. The flow rate limits of $N_2O$ may be selected based on the particular equipment in which the process is used. However, in particular embodiments the flow rate limits of $N_2O$ may be as low as about 2 Standard Liters per Minute (SLM) or as high as about 8 SLM. In further embodiments, flow rate limits of from about 3 to about 5 SLM may be preferred.

For a 6 inch diameter furnace tube, flow rates of from 2 SLM to 8 SLM result in gas velocities as low as about 0.37 cm/sec or as high as about 1.46 cm/sec or, and flow rates of from 3 to 5 SLM result in velocities of from about 0.55 cm/s to about 0.95 cm/s. In particular, for an L2 distance of about 12 inches (about 30.48 cm) and an L3 distance of about 18 inches (about 45.72 cm), such velocities result in an initial residence time of from about 11 seconds to about 45 seconds and a total residence of from about 28 seconds to about 112 seconds. In particular preferred embodiments, the initial residence time is from about 16 second to about 31 seconds and a total residence time of from about 41 to about 73 seconds. The $N_2O$ anneal may be carried out for about 3 hours, however, anneals of from about 30 minutes to about 6 hours may also be utilized although longer times may also be utilized.

As is further illustrated in FIG. 2, the $N_2O$ anneal may be followed by an optional anneal (block 34) in an inert gas, such as argon or $N_2$. Such an anneal may be carried out for about 1 hour, however, anneals of up to about 3 hours or longer may also be utilized.

As seen in FIGS. 3 through 10, it has been found that, by appropriately controlling the anneal temperature and $N_2O$ flow rate in accordance with the present invention, the $SiC/SiO_2$ interface quality may be improved, rather than damaged as taught by Lai et al.

While not wishing to be bound by any theory of operation, it appears that at high temperatures (above 800° C.), a fraction of $N_2O$ will breakdown into $N_2$, $O_2$ and NO. The fraction of NO is determined by the temperature and the amount of time the gas remains at elevated temperatures, which is determined by the flow rate of the gas, the cross-sectional area of the furnace tube and the distances in the tube. Table 1 shows the effect of the flow rate of $N_2O$ on the maximum interface state density for an anneal of 3 hours at 1175° C., followed by a 1 hour Ar anneal after the $N_2O$ anneal.

TABLE 1

Effect of Flow Rate on $N_2O$ Anneal.

| Flow Rate | Maximum Interface State Density ($10^{12}$ cm$^{-2}$ eV$^{-1}$) |
|---|---|
| no anneal | 2.7 |
| 8 SLM (1.46 cm/s) | 1.5 |
| 6 SLM (1.10 cm/s) | 0.7 |
| 4 SLM (0.73 cm/s) | 0.6 |
| 2 SLM (0.37 cm/s) | 1.0 |

As shown in Table 1, the anneal with 4 SLM of $N_2O$ has the lowest interface state densities, and the most negative flat-band voltage. Accordingly, in particular embodiments of the present invention flow rates of from about 4 to about 6 SLM may be utilized.

FIGS. 3 through 10 illustrate the relationship between interface trap density (Dit) to position in the bandgap at the SiC/SiO2 interface for various embodiments of the present invention.

Figure 3:
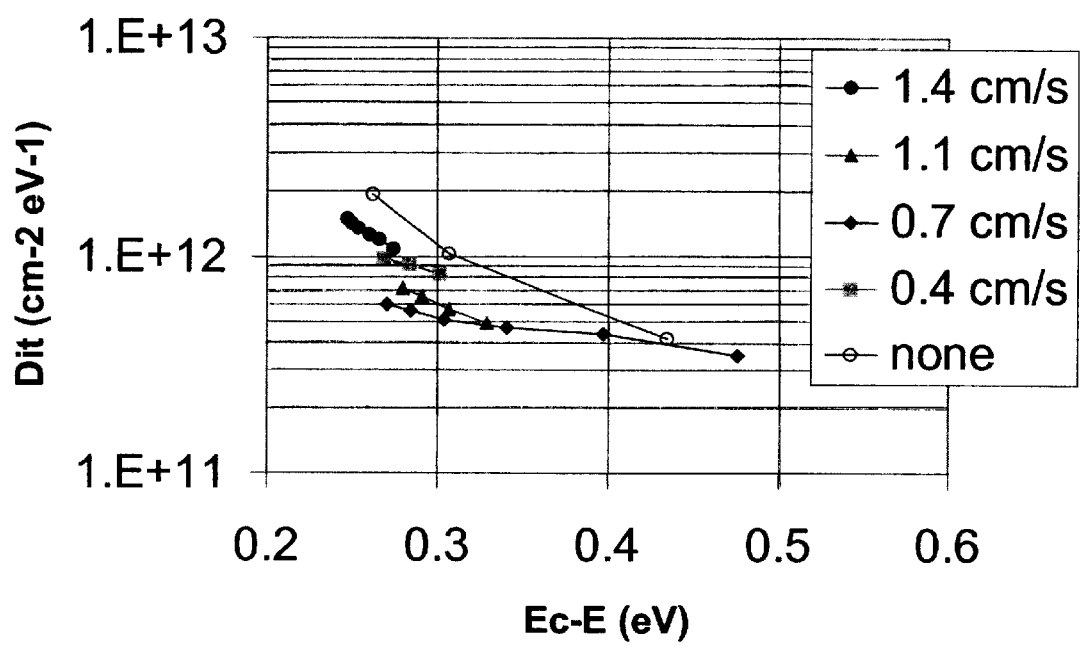
FIG. 3 is a graph illustrating the interface trap density versus energy level from the conduction band ($E_c$-E) for various flow rates of $N_2O$ at 1175° C.

FIG. 3 illustrates the interface trap density versus energy level for various velocities of $N_2O$ for the flow rates in Table 1 with an anneal temperature of 1175° C. As seen in FIG. 3, while each of the flow rates result in a reduced trap density as compared to no N2O anneal, the greatest reduction in trap density is provided by flow rates yielding velocities of 0.7 cm/s and 1.1 cm/s with the lowest trap density provided by illustrates that the optimal flow rate is approximately 0.7 cm/s (or approximately 4 SLM).

Figure 4:
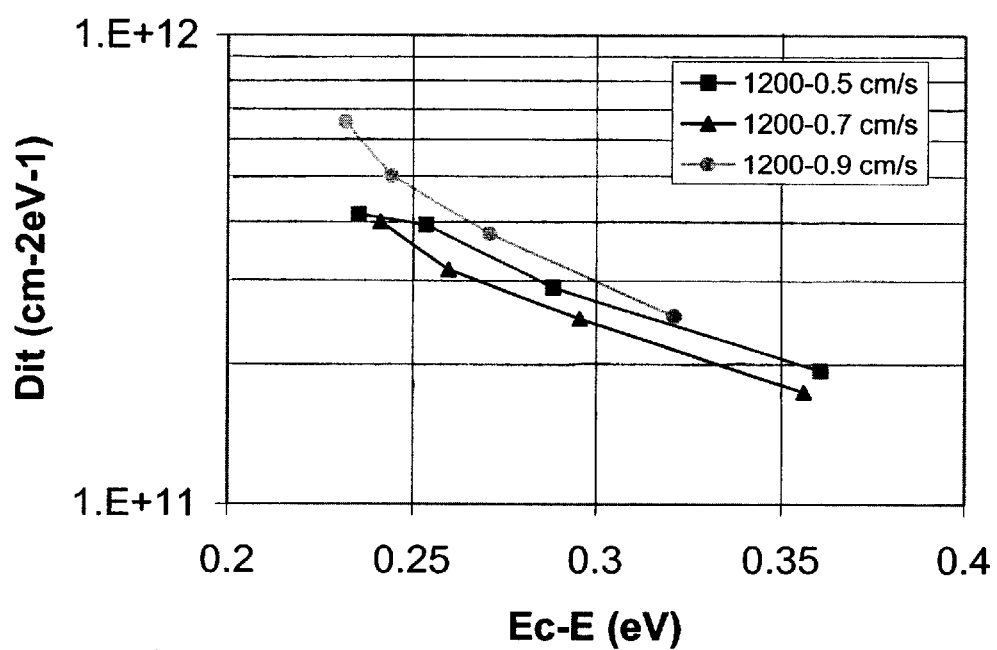
FIG. 4 is a graph of interface trap density (Dit) versus energy level from the conduction band for various flow rates at 1200° C.

FIG. 4 is a graph of Dit versus energy level for various velocities with an anneal temperature of 1200° C. FIG. 4 likewise indicates that for a 1200° C. anneal, the greatest reduction in trap density is achieved with a velocity of approximately 0.7 cm/s (or approximately 4 SLM). Thus, from FIGS. 3 and 4, initial residence times of about 22 seconds may provide the greatest reduction in trap density.

Figure 5:
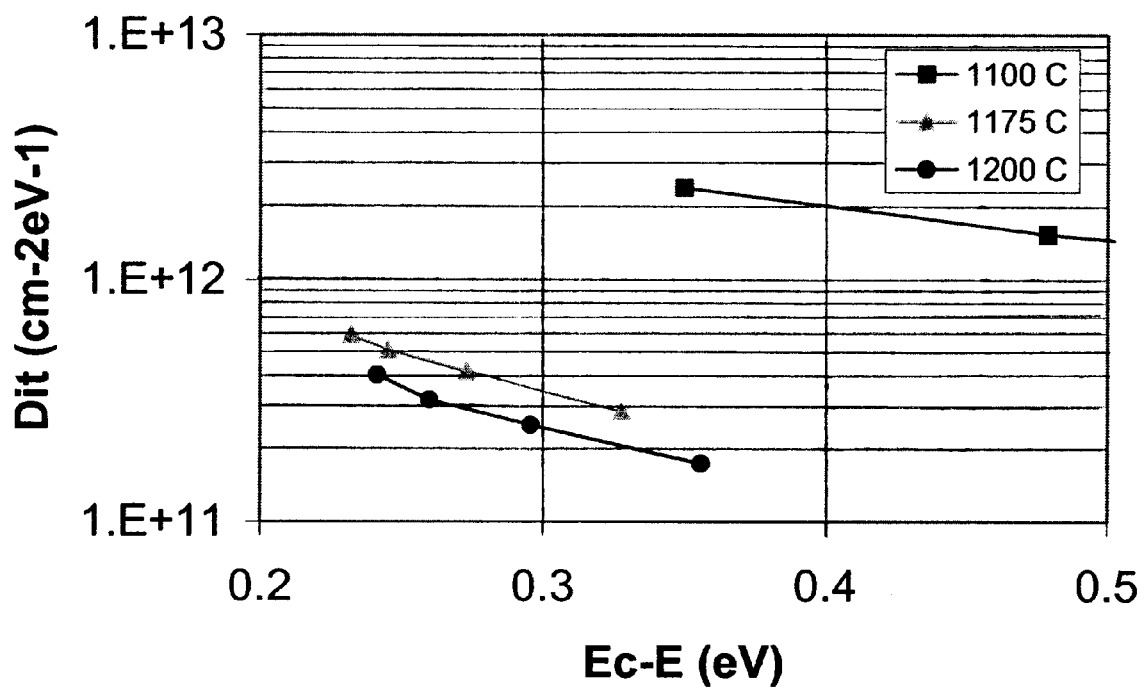
FIG. 5 is a graph of Dit versus energy level from the conduction band for various anneal temperatures.

FIG. 5 is a graph of Dit versus energy level for various anneal temperatures. FIG. 5 illustrates that the temperature should be above 1100° C. to obtain a reduction in Dit, and preferably above 1175° C.

Figure 6:
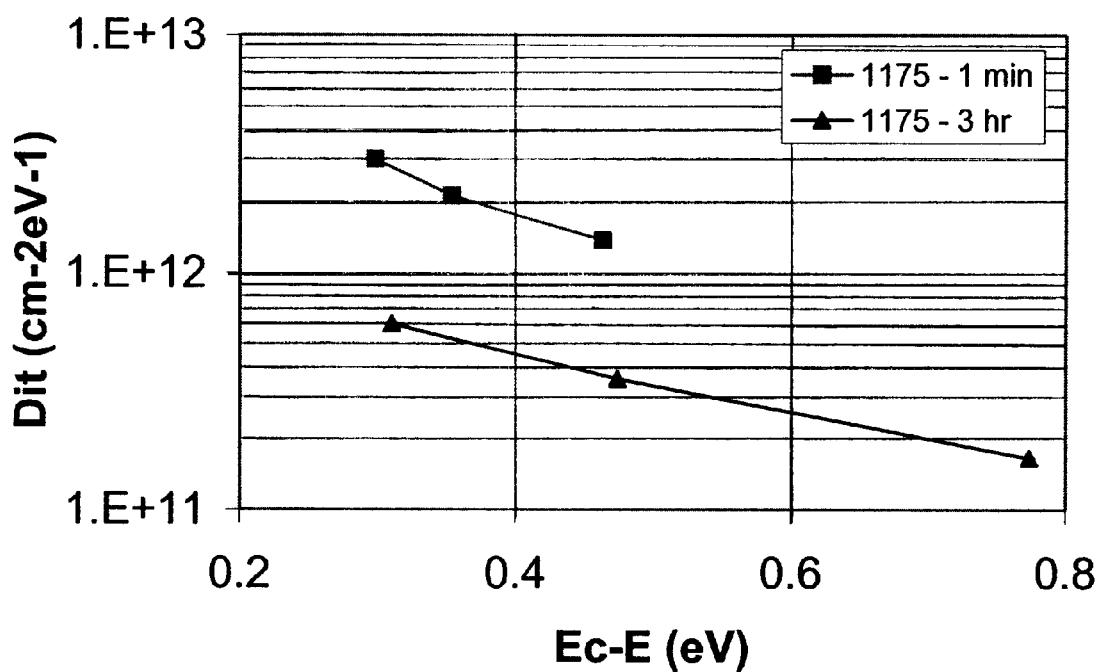
FIG. 6 is a graph of Dit versus energy level from the conduction band at 1175° C. for anneals of various different durations.

FIG. 6 is a graph of Dit versus energy level at 1175° C. for anneals of different durations, namely one minute and three hours. As seen in FIG. 6 a reduction in trap density is achieved by a longer duration anneal (3 hours) over a short duration anneal (1 minute).

Figure 7:
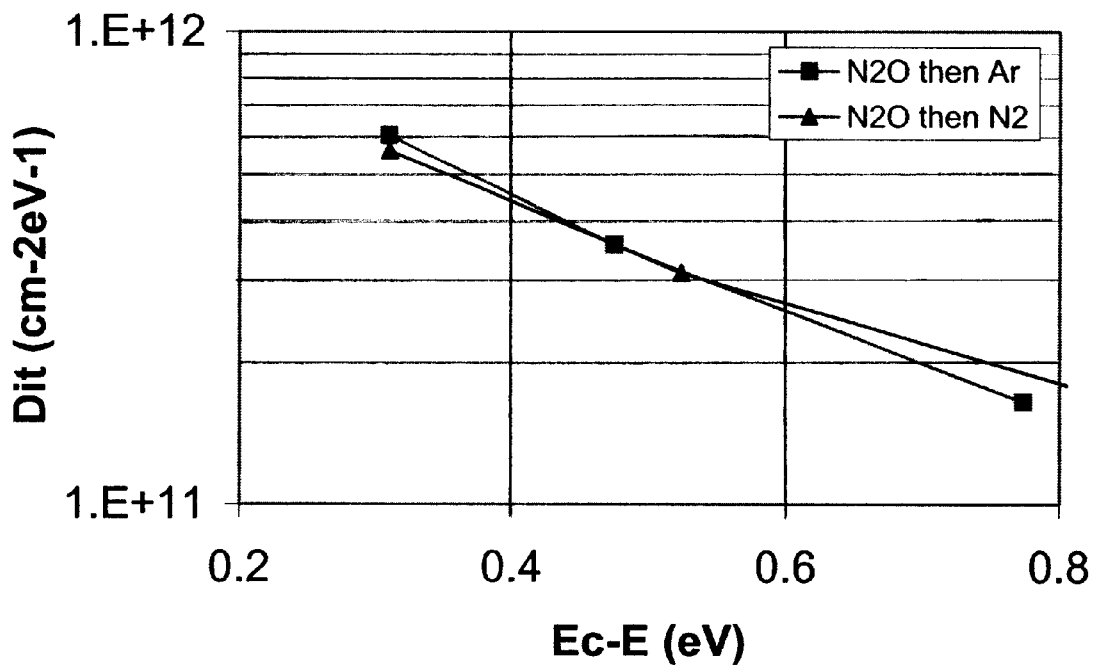
FIG. 7 is a graph of Dit versus energy level from the conduction band for a post-treatment anneal in Ar and $N_2$.

FIG. 7 is a graph of Dit versus energy level for a post-treatment anneal in Ar and $N_2$. FIG. 7 indicates that both atmospheres are suitable for purposes of the present invention, since they produce substantially similar results.

Figure 8:
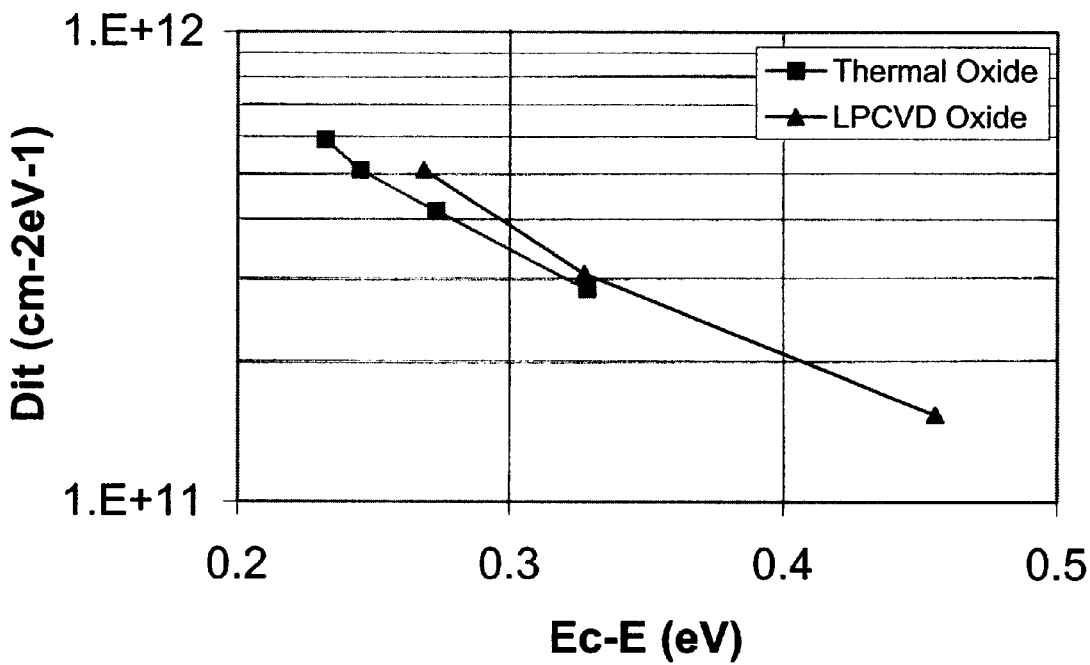
FIG. 8 is a graph of Dit versus energy level from the conduction band for an initial thermal oxide and an initial LPCVD oxide.

FIG. 8 is a graph of Dit versus energy level for two different types of oxides, a thermal oxide and an LPCVD oxide. FIG. 8 illustrates that trap densities may be reduced utilizing embodiments of the present invention for both types of oxides as similar results are achieved for both types of oxide.

Figure 9:
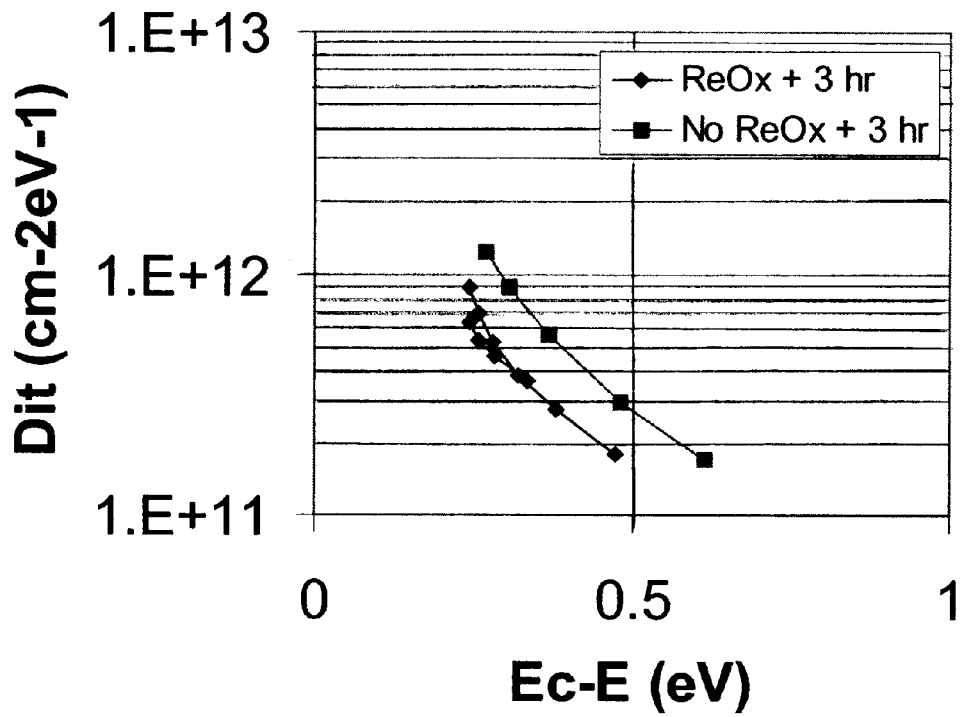
FIG. 9 is a graph of Dit versus energy level from the conduction band for oxide layers formed with and without a wet reoxidation.

FIG. 9 is a graph of Dit versus energy level for anneal times of 3 hours where the oxide layer included a wet reoxidation as described in U.S. Pat. No. 5,972,801, and for an anneal which did not utilize a wet reoxidation process. As can be seen from FIG. 9, decreased interface densities were achieved when a wet re-oxidation process was utilized.

Figure 10:
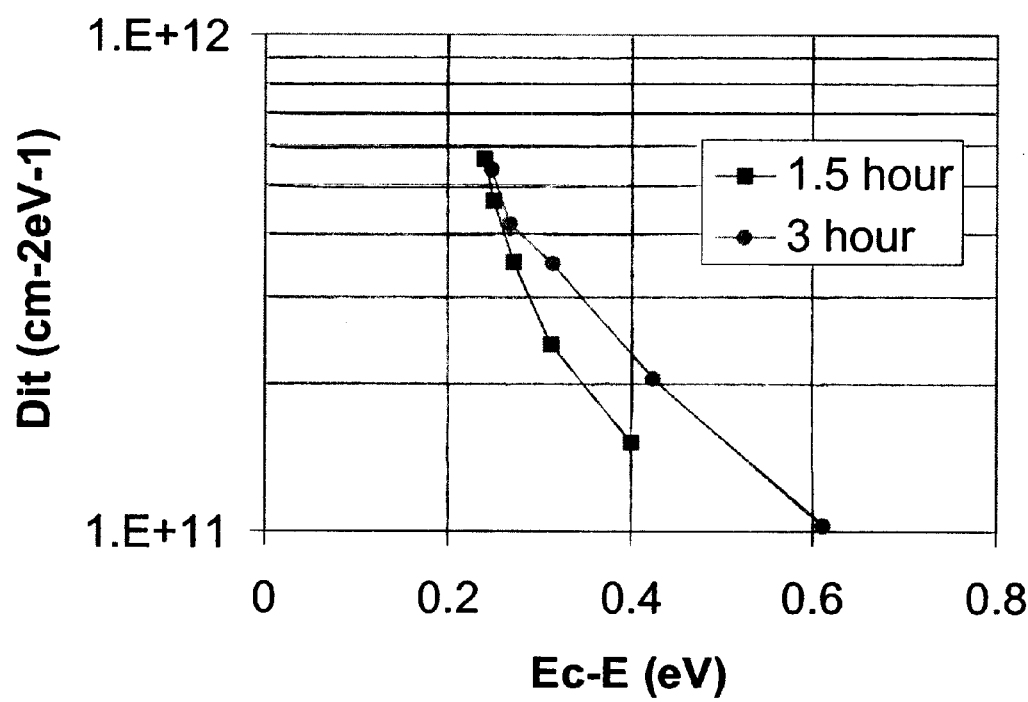
FIG. 10 is a graph of Dit versus energy level from the conduction band at 1175° C. for anneals of various different durations.

FIG. 10 is a graph of Dit versus energy level for durations of 1.5 and 3 hours. As can be seen from FIG. 10, it appears that durations as long as 3 hours may be no more effective, and possible less effective, than durations of about 1.5 hours. However, either duration appears to provide acceptable results.

As is illustrated by FIGS. 3–10 above, through use of embodiments of the present invention, interface trap densities for oxide layers formed on silicon carbide may be reduced utilizing an $N_2O$ anneal without the need for a subsequent wet $O_2$ anneal.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of fabricating a silicon carbide structure, comprising;
   forming an oxide layer on a silicon carbide layer; and
   annealing the oxide layer in an $N_2O$ environment using a predetermined temperature profile which includes an anneal temperature of greater than about 1100° C. and a flow rate profile which includes a flow rate which provides an initial residence time of the $N_2O$ of at least about 11 seconds.

2. A method according to claim 1, wherein the initial residence time is from about 11 seconds to about 45 seconds.

3. A method according to claim 1, wherein the initial residence time is from about 26 seconds to about 31 seconds.

4. A method according to claim 2, wherein a total residence time of the $N_2O$ is from about 28 seconds to about 112 seconds.

5. A method according to claim 3, wherein a total residence time of the $N_2O$ is from about 41 seconds to about 73 seconds.

6. A method according to claim 1, wherein the anneal temperature is at least about 1175° C.

7. A method according to claim 6, wherein the anneal temperature is about 1200° C.

8. A method according to claim 1, wherein the flow rate profile provides a flow rate of from about 2 Standard Liters per Minute (SLM) to about 8 SLM.

9. A method according to claim 1, wherein the flow rate profile provides a flow rate of from about 3 to about 5 Standard Liters per Minute.

10. A method of fabricating a silicon carbide structure, comprising;
    forming an oxide layer on a silicon carbide layer;
    annealing the oxide layer in an $N_2O$ environment using a predetermined temperature profile which includes an anneal temperature of greater than about 1100° C. and a flow rate profile which includes a flow rate which provides an initial residence time of the $N_2O$ of at least about 11 seconds; and
    wherein the step of annealing the oxide layer is carried out for about 3 hours.

11. A method according to claim 1, wherein the step of annealing the oxide layer is carried out for about 1.5 hours.

12. A method of fabricating a silicon carbide structure, comprising;
    forming an oxide layer on a silicon carbide layer;
    annealing the oxide layer in an $N_2O$ environment using a predetermined temperature profile which includes an anneal temperature of greater than about 1100° C. and a flow rate profile which includes a flow rate which provides an initial residence time of the $N_2O$ of at least about 11 seconds; and
    wherein the step of annealing the oxide layer is followed by the step of annealing the oxide layer in at least one of Ar and $N_2$.

13. A method according to claim 12, wherein the step of annealing the oxide layer in at least one of Ar and $N_2$ is carried out for about one hour.

14. A method according to claim 1, wherein the predetermined flow rate provides a velocity of the $N_2O$ of from about 0.37 cm/s to about 1.46 cm/s.

15. A method according to claim 14, wherein the predetermined flow rate provides a velocity of the $N_2O$ of from about 0.5 cm/s to about 1 cm/s.

16. A method according to claim 1, wherein the step of forming the oxide layer comprises the step of depositing the oxide layer.

17. A method according to claim 1, wherein the step of forming the oxide layer comprises the step of thermally growing the oxide layer.

18. A method according to claim 1, wherein the step of forming the oxide layer further comprises performing a wet reoxidation of the oxide layer.

19. A method according to claim 1, wherein the silicon carbide layer comprises 4H polytype silicon carbide.

20. A method of fabricating a silicon carbide structure, comprising;
    forming an oxide layer on a silicon carbide layer; and
    annealing the oxide layer in an $N_2O$ environment using a predetermined temperature profile including an anneal temperature of greater than 1100° C. and at a predetermined flow rate profile of $N_2O$, wherein the predetermined temperature profile and the predetermined flow rate profile are selected so as to reduce interface states of the oxide/silicon carbide interface with energies near the conduction band of SiC.

21. A method according to claim 20, wherein the anneal temperature is greater than about 1175° C.

22. A method according to claim 21, wherein the anneal temperature is about 1200° C.

23. A method according to claim 20, wherein the predetermined flow rate profile provides a flow rate of from about 2 Standard Liters per Minute (SLM) to about 8 SLM.

24. A method according to claim 23, wherein the flow rate is from about 3 to about 5 Standard Liters per Minute.

25. A method of fabricating a silicon carbide structure, comprising;
    forming an oxide layer on a silicon carbide layer;
    annealing the oxide layer in an $N_2O$ environment using a predetermined temperature profile and at a predetermined flow rate profile of $N_2O$, wherein the predetermined temperature profile and the predetermined flow rate profile are selected so as to reduce interface states of the oxide/silicon carbide interface with energies near the conduction band of SiC; and
    wherein the step of annealing the oxide layer is carried out for about 3 hours.

26. A method according to claim 20, wherein the step of annealing the oxide layer is carried out for about 1.5 hours.

27. A method of fabricating a silicon carbide structure, comprising;

forming an oxide layer on a silicon carbide layer;

annealing the oxide layer in an $N_2O$ environment using a predetermined temperature profile and at a predetermined flow rate profile of $N_2O$, wherein the predetermined temperature profile and the predetermined flow rate profile are selected so as to reduce interface states of the oxide/silicon carbide interface with energies near the conduction band of SiC; and then annealing the oxide layer in at least one of Ar and $N_2$.

28. A method according to claim 27, wherein the step of annealing the oxide layer in at least one of Ar and $N_2$ is carried out for about one hour.

29. A method according to claim 20, wherein the predetermined flow rate profile provides a velocity of the $N_2O$ of from about 0.37 cm/s to about 1.46 cm/s.

30. A method according to claim 29, wherein the predetermined flow rate profile provides a velocity of the $N_2O$ of from about 0.5 cm/s to about 1 cm/s.

31. A method according to claim 20, wherein the step of forming the oxide layer comprises the step of depositing the oxide layer.

32. A method according to claim 20, wherein the step of forming the oxide layer comprises the step of thermally growing the oxide layer.

33. A method according to claim 20, wherein the step of forming the oxide layer further comprises performing a wet reoxidation of the oxide layer.

34. A method according to claim 20, wherein the silicon carbide layer comprises a 4H polytype silicon carbide layer.

\* \* \* \* \*